United States Patent [19]

Johnston et al.

[11] 4,218,140

[45] Aug. 19, 1980

[54] LIGHT METER

[75] Inventors: Jerome E. Johnston; Lyle R. Middendorf; William W. Biggs, all of Lincoln, Nebr.

[73] Assignee: Lambda Instruments Co., Lincoln, Nebr.

[21] Appl. No.: 935,553

[22] Filed: Aug. 21, 1978

[51] Int. Cl.³ .................... G01J 1/44; G01R 19/18
[52] U.S. Cl. ................................ 356/226; 324/118
[58] Field of Search .................... 356/226; 324/118

[56] References Cited

U.S. PATENT DOCUMENTS

| 3,704,950 | 12/1972 | Rosencranz | 356/226 |
| 3,790,288 | 2/1974 | Hostetter | 356/226 |
| 4,043,676 | 8/1977 | Holzinger et al. | 356/226 |

OTHER PUBLICATIONS

"A New Multi-Function Voltmeter for General LaboratorHewlett-Packar Journal, vol. 14, No. 9-10, May 1963, p. 3.

*Primary Examiner*—John K. Corbin
*Assistant Examiner*—Rodney B. Bovernick
*Attorney, Agent, or Firm*—Vincent L. Carney

[57] ABSTRACT

To permit a portable light meter to operate without zero adjustment and without excessive battery drain, a chopper-stabilized amplifier amplifies the DC signal from the light sensor of the light meter. The chopper in the chopper-stabilized amplifier is an FET circuit having a high impedance compensating circuit to avoid battery drain while compensating for interelectrode capacitance. The power supply obtains the ground level potential from the output of an operational amplifier with negative and positive potentials being generated from that reference potential so as to not require a center tap on the battery pack.

15 Claims, 4 Drawing Figures

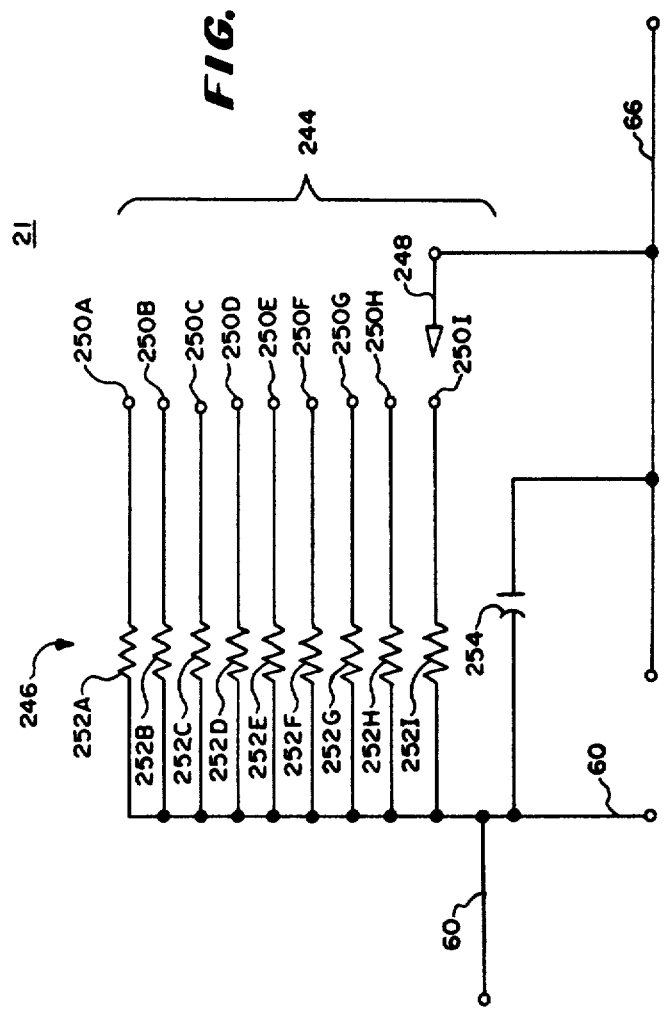

LIGHT METER

This invention relates to light meters.

In one class of light meter, the amplifier receives DC signals from a sensor, amplifies these signals and records them to provide an indication of changes in light intensity or light flux. A power supply supplies electrical power to the circuitry.

In the prior art light meters of this class, a zero adjustment is needed to adjust for drift and to compensate for the potential drop in the lead lines between the sensor and the amplifier. Moreover, these units normally require a large amount of power and therefore are not well adapted for portable use.

Accordingly, it is an object of the invention to provide a novel portable light meter.

It is a further object of the invention to provide a light meter which does not require a manually-controlled zero adjustment.

It is a still further object of the invention to provide a light meter with sufficiently low power demand to permit use of relatively low cost and readily available batteries.

It is a still further object of the invention to provide a portable light meter having a chopper-stabilized amplifier for preventing drift when amplifying DC signals.

It is a still further object of the invention to provide a light meter having a chopper-stabilized amplifier with a high impedance input to the first-stage chopper AC amplifiers.

It is a still further object of the invention to provide a power supply which is stable and does not require a center tap in the battery pack to establish a ground reference with respect to positive and negative potentials applied to a light meter.

It is a still further object of the invention to provide a light meter with low power drain.

It is a still further object of the invention to provide a light meter that does not require a user zero adjustment.

It is a still further object of the invention to provide a chopper-stabilized amplifier with low power drain and desirable low-noise characteristics.

In accordance with the above and further objects of the invention, a portable light meter includes a chopper-stabilized amplifier to amplify a DC signal from the light sensor. DC and AC components of a signal are separated, amplified and combined before being applied to a meter.

A chopper-stablized amplifier includes an FET chopped-signal modulating circuit including a noise spike cancellation network with a high impedance. Because of the high impedance of the noise canceling network, drain on the batteries supplying the light meter is reduced.

The battery supply for the light meter develops a ground level potential at the output of an operational amplifier and positive and negative values at the outputs of other active components to avoid a center tap in the battery pack.

It is known to use chopper-stabilized amplifiers to avoid DC drift but the use of such amplifiers in a portable light meter causes difficulties and such circuits have not been used in the prior art. The difficulties occur because of the need for reducing power drain and for preventing noise spikes by the chopper FET at the input of the chopper amplifier.

The above noted and other features of the invention will be better understood from the following detailed description when considered with reference to the accompanying drawings in which:

FIG. 4 is a schematic circuit diagram of a feedback circuit used in the embodiment of FIG. 1.

Figure 1:
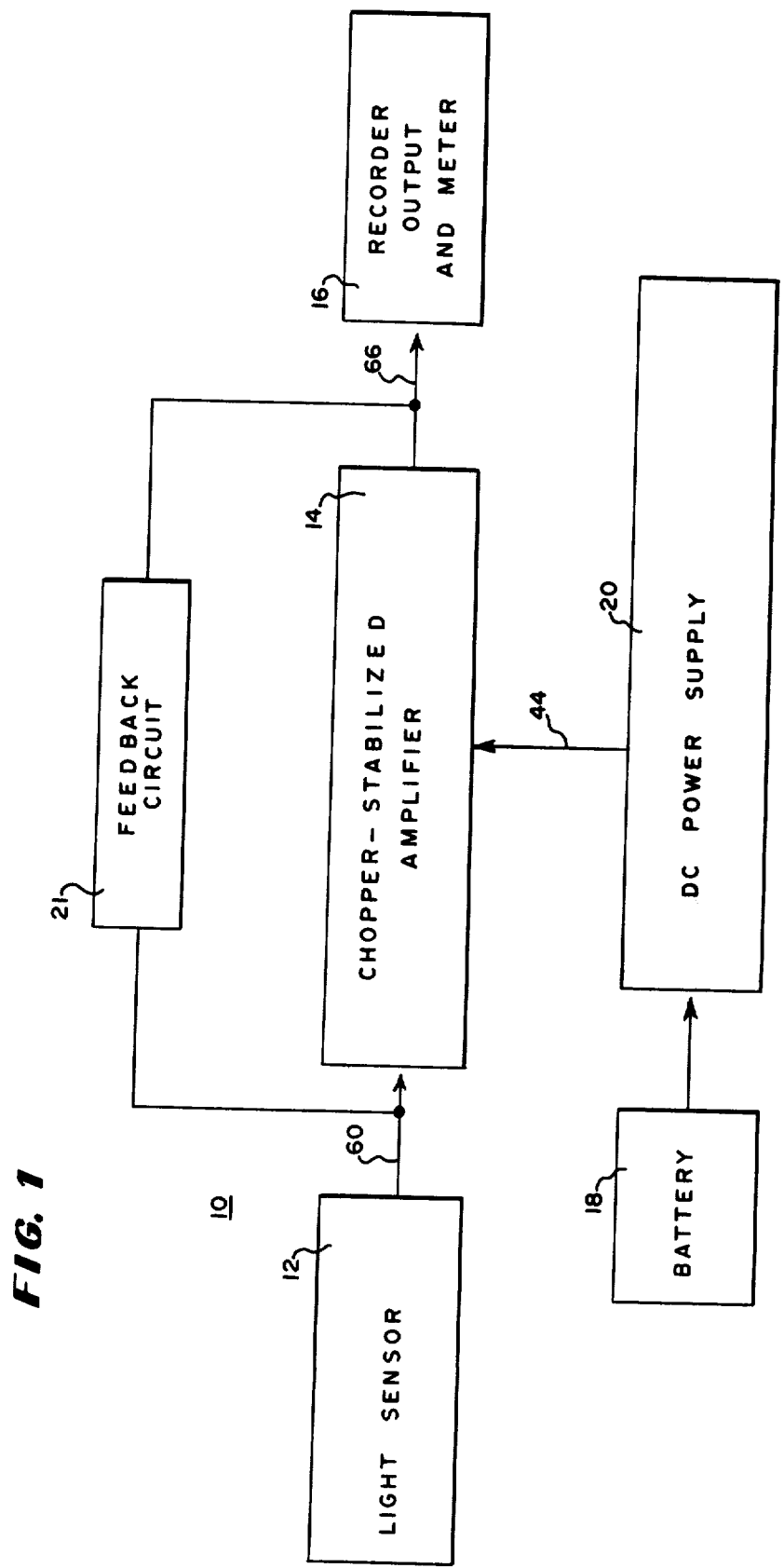
FIG. 1 is a block diagram of a light meter in accordance with an embodiment of the invention.

In FIG. 1, there is shown a block diagram of a light meter 10 having a light sensor 12, a chopper-stabilized amplifier 14, a recorder output and meter 16, a battery 18, a DC power supply 20, and a feedback circuit 21. The DC power supply 20 is energized by the battery 18 and supplies power to the chopper-stabilized amplifier 14. The light sensor 12 applies signals to the chopper-stabilized amplifier 14 which amplifies them and provides signals to the recorder output and meter 16 for recording and indicating. The feedback circuit 21 is connected between the output of the chopper-stabilized amplifier and its input to stabilize it and to establish its gain. The light meter 10 is designed to have low power consumption and to minimize DC drift so that it is not necessary for the user to re-zero the instrument.

Figure 2:
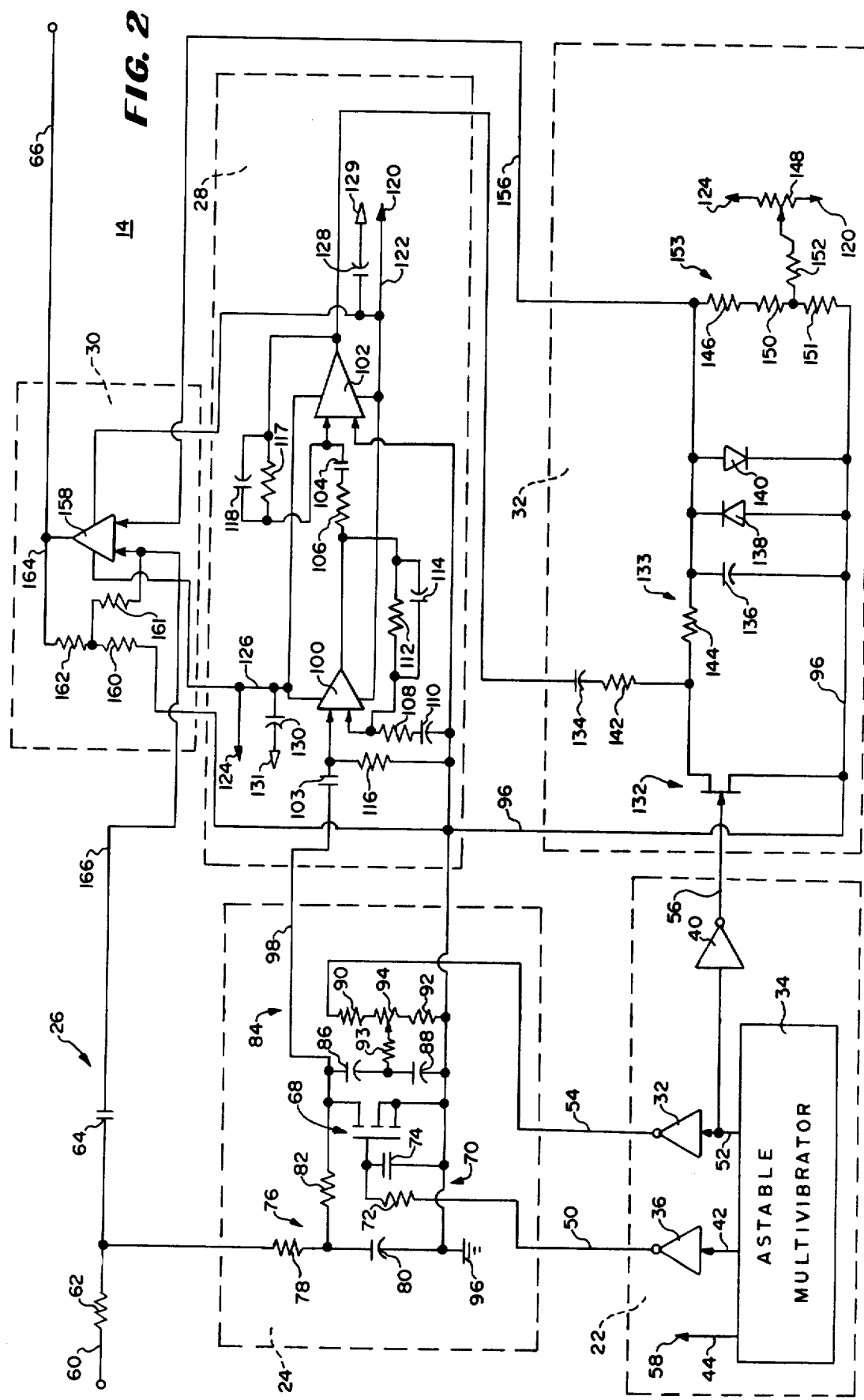
FIG. 2 is a schematic circuit diagram of a chopper-stabilized amplifier used in the embodiment of FIG. 1.

In FIG. 2, there is shown a schematic circuit diagram of the chopper-stabilized amplifier 14 having a square wave generator 22, an input signal-chopping modulator circuit 24, and AC signal path 26, a chopped-signal AC amplifier circuit 28, a final amplifier circuit 30 and a chopped-signal demodulating and filter circuit 32.

The AC path 26 applies higher frequency input signals from the light sensor 12 (FIG. 1) to the final amplifier circuit 30. Lower frequency and DC signals from the light sensor 12 (FIG. 1) are applied to the final amplifier circuit 30 after that signal has been processed by the input signal-chopping modulator circuit 24, the chopped-signal AC amplifier circuit 28, and the chopped-signal demodulating and filter circuit 32. The input signal-chopping modulator circuit 24 and the chopped-signal demodulating and filter circuit 32 are controlled by pulses generated with the square wave generating circuit 22 to which they are connected.

To generate pulses for controlling the input signal-chopping modulator circuit 24 and the chopped-signal demodulating and filter circuit 32, the square wave generating circuit 22 includes an astable multivibrator 34, and first, second, and third buffer inverters 36, 38 and 40. The output at one pin of the astable multivibrator 34 is connected to the input of buffer inverter 36 through a conductor 42 and is the inverse or 180° out of phase with the output at the other pin which is connected to the inputs of buffer inverters 38 and 40 through a conductor 52.

The output of the buffer inverter 36 is electrically connected to the input signal-chopping modulator circuit 24 through a conductor 50; and the outputs of the buffer invertes 38 and 40 are electrically connected to the input signal-chopping modulator circuit 24 through a conductor 54 and to the chopped-signal demodulating and filter circuit 32 through a conductor 56 respectively.

The multivibrator 34 is a type sold by RCA under the designation CD 4047 AE and provides an output to two pins at a repetition rate of 200 hertz. It is electrically connected to a source of a negative 10 volts 58 to receive current for operation of the square wave generating circuit 22.

To be adjusted for 200 hertz, the astable multivibrator 34 has an externally connected impedance in its timing circuit including a 0.01 microfarad capacitor with one plate connected to one pin and a 100 K (kilohm) 1% resistor with one end connected to another pin, the other plate of the capacitor and the other end of the resistor being connected to a third pin. However, many different types of low power multivibrators may be used since it is only essential to provide a frequency suitable for chopping.

To receive signals from the light sensor 12, the AC signal path 26 and the input signal-chopping modulator circuit 24 are each electrically connected to the light sensor 12 (FIG. 1) through a conductor 60 and a 10 K resistor 62. The AC signal path 26 includes a 0.047 microfarad capacitor 64 having one plate electrically connected to one end of the resistor 62 and the other plate electrically connected to the final amplifier circuit 30 to apply the higher-frequency input signals from the light sensor 12 directly to the final amplifier circuit 30. Normally, the signal from the sensor 12 is either AC or DC, but if it is mixed the AC component and DC component are combined in the final amplifier, after the DC component has been processed, to provide an output signal to the recorder output and meter 16 (FIG. 1) through a conductor 66.

To convert the DC component of the signal from the light sensor 12 to an AC signal representative of the DC portion, the input signal-chopping modulator circuit 24 incudes an FET transistor 68, a filter 76, and an FET matching and noise spike cancellation network 84.

To pass the DC and lower frequency AC components of the signal from the light sensor 12 and block the higher frequency components, the filter 76 includes first and second 100 K (kilohm) resistors 48 and 82 and a 0.047 microfarad capacitor 80 with one end of the resistor 78 being electrically connected to conductor 60 through the 10 K resistor 62 and its other end connected to one plate of the capacitor 80 and one end of the resistor 82. The other plate of the capacitor 80 is connected to signal ground at 96 and the other end of resistor 82 is electrically connected to the drain of the FET transistor 68.

To receive the pulses applied to the FET transistor 68 from the square wave generating circuit 22, the FET input circuit 70 includes a 31.6 K resistor 72 and an 8.2 picofarad capacitor 74, with one end of the resistor 72 being connected to conductor 50 and its other end being connected to the control of the FET transistor 68 and to signal ground 96 through the capacitor 74. With these connections, the pulses from the astable multivibrator 34 are applied to the control electrode of the FET transistor 68, reducing the pulse switching transient (increasing rise time) to the gate of FET transistor 68 with the RC network of resistor 72 and capacitor 74.

The FET transistor 68 has its source electrically connected to signal ground 96 and is a 3N164 FET transistor. Its drain, besides being connected to resistor 82, is electrically connected to the input of the chopped-signal AC amplifier circuit 28 through a conductor 98.

To approximately balance the interelectrode capacitance of the FET transistor 68, the input signal-chopping modulating circuit 24 includes a matching and noise spike cancellation network 84, having: (1) a first 1.8 picofarad capacitor 86 which is approximately the combination of the interelectrode and stray capacitance between the drain and control electrodes of the FET transistor 68, the stray capacitance being due to component placement; and (2) a second 6.8 picofarad capacitor 88, in combination with resistor 93, 90, 92 and potentiometer 94.

Capacitors 86 and 88 each have one of their plates electrically connected to 23.7 K resistor 93, which is connected to the center tap of a 50 K potentiometer 94, one end of which is electrically connected to conductor 54 through a 115 K resistor 90 and the other end of which is electrically connected to a signal ground 96 through a 23.7 K resistor 92. The other plate of capacitor 86 is electrically connected to the drain of FET 68 and the other plate of capacitor 88 is electrically connected to the source of FET 68.

With this arrangement, the negative pulses on conductor 50 cause the FET transistor 68 to conduct, thus interrupting the signal passing through the filter 76 to conductor 98 whereas positive signals permit the signal to pass. This chops the incoming signal to form a pulsed DC signal which becomes an AC signal upon passing through capacitor 103.

The high impedance formed by the capacitors 88 and 86 to the chopped signal cause this signal to be conducted through conductor 98 through capacitor 103 to the input of amplifier 100. The resistor 72 and the capacitor 74 provide an RC time network that increases the pulse rise time on the gate of FET 68. This reduces the noise spike coupled through the FET 68 between its gate and drain interelectrode capacitance into the signal on conductor 98.

The amplitude of the signal on conductor 54, which is 180° out of phase with the signal on conductor 50, it adjusted by potentiometer 94 in combination with resistors 90 and 92. Resistor 93 and capacitor 88 help shape the rise time to be comparable to that of the spike across the internal capacitance of the FET 68 but not of phase by 180°. Consequently, the spikes through the interelectrode capacitance of FET 68 are cancelled by the spikes produced from the square wave on conductor 54, which are substantially the same amplitude, opposite in phase and occur substantially at the same time. Potentiometer 94 is adjusted so that the average amplitudes of the spikes cancel out almost exactly. The high impedances of resistors 92, 94 and 90 reduce current demand from buffer inverter 38 and thus further reduce power needs. These impedances are higher than those that would normally be used in a noise spike cancelling network.

To amplify the chopped signal on conductor 98 without causing excessive power drain or noise, the chopped-signal AC amplifier circuit 28 included first and second amplifiers 100 and 102, which are National LM 308H and RCA CA 3130 T type amplifiers respectively.

The noninverting input off amplifier 100 is connected to: (1) conductor 98 through a 0.047 microfarad capacitor 103 and has it output electrically connected to the input of amplifier 102 through a 1 K resistor 106 and a 15 microfarad capacitor 104; and (2) signal ground 96 through a 1 M resistor 116 which ensures high input impedance to amplifier 28. This large impedance provides large signal transfer to the amplifier. The resistor is mounted on its end with ground at its top and a printed circuit shield at the bottom to prevent noise transfer to the amplifier.

The inverting input of amplifier 100 is electrically connected to: (1) signal ground 96 through a 470 ohm resistor 108 and a 33 microfarad capacitor 110 to receive AC signals across the resistor 108 for amplification while only allowing unity gain amplification of DC by blocking DC current with capacitor 110 and thus avoiding a DC bias across resistor 108; and (2) the output of amplifier 100 through a 47 K resistor 112 and a 180 picofarad capacitor 114 which provides feedback and shorts out high frequency signals, thus limiting bandwidth.

To provide further amplification of the chopped signal, the noninverting input of amplifier 102 is grounded and the inverting input is connected to: (1) one end of the capacitor 104; and (2) the output of amplifier 102 through a parallel 62 K resistor 117 and a 180 picofarad capacitor 118 forming a feedback network. The output of amplifier 102 is electrically connected to the input of the chopped-signal demodulating and filter circuit 32.

Amplifiers 100 and 102 are each electrically connected to a source of a negative 2.5 volts 120 through a conductor 122 and to a source of a positive 2.5 volts 124 through a conductor 126. Of course, frequency compensation adjustment with external capacitors (not shown) are included. Conductor 122 is connected to ground 129 through a 2.2 microfarad capacitor 128 and conductor 126 is connected to ground 131 through a 2.2 microfarad capacitor 130. The amplifier 100 is a low noise amplifier and the amplifier 102 has greater possible swing within the range of the power supply. Because the noise spike has been reduced in amplitude by the noise spike cancelling network, amplifiers with lower power supply voltages can be used to provide the dynamic range necessary to amplify input signals.

To demodulate chopped DC signals from the chopped-signal AC amplifier circuit 28, prior to applying them to the final amplifier circuit 30, the chopped-signal demodulating and filter circuit 32 includes an FET 132, a filter circuit 133, first and second diodes 138 and 140, an offset trimming circuit 153, a capacitor 134 and a resistor 142.

The FET 132 is a 2N4393 type having its control electrode electrically connected to conductor 56 to receive output pulses from the buffer inverter 40. Its drain is electrically connected to the output of amplifier 102 in the chopped-signal AC amplifier circuit 28 through the capacitor 134 and resistor 142 and its source is grounded at 96. A 0.047 microfarad capacitor 134 allows only AC signals from amplifier 28 and a 51 K resistor 142 provides short circuit protection to amplifier 102 when FET 132 conducts to demodulate the AC signal into an amplified DC signal.

A 5.1 M resistor 144 and a 3.3 microfarad capacitor 136 function as a filter to produce a steady DC voltage from the demodulated output. The drain electrode of the FET 132 is electrically connected to one end of resistors 144 and 142, the other end of resistor 144 being connected to the cathode of diode 138, to the anode of diode 140, to one end of resistor 146, to conductor 156 and to one plate of capacitor 136. The other plate of capacitor 136, the anode of diode 138 and the cathode of diode 140 are connected to signal ground 96.

The offset trimming circuit 153 is connected in series between the other side of resistor 144 and signal ground 96. The capacitor 136 and resistor 144 have a 1.6 millisecond time constant and provide a DC output in response to the demodulated output of the amplifier 102.

To adjust the offset of the final amplifier 30, the offset trimming circuit 153 includes a 22 M resistor 146, a 22 M resistor 150, a 100 K resistor 151, a 100 K potentiometer 148, and a 220 K resistor 152. The potentiometer 148 has: (1) its adjustable center tap electrically connected to one end of resistor 152: (2) one end electrically connected to a negative 2.5 volt source 120; and (3) its other end electrically connected to a positive 2.5 volt source 124. The resistor 152 has its other end electrically connected to ground 96 through resistor 151 and to conductor 156 through resistors 146 and 150.

With this arrangement, the FET 132 demodulates the output from the chopped-signal AC amplifier circuit 28 from an AC amplified version of the modulated DC input signal and applies this to filter circuit 133 to once again be a DC signal but in amplified form. The amplitude of the filtered signal is prevented from exceeding approximately 0.6 volts positive or negative by the diodes 138 and 140 to prevent overdriving the amplifier circuit 30 when turning the instrument on. This signal is applied through conductor 156 to the final amplifier circuit 30.

To amplify and, under some circumstances, to combine the AC input component from the AC signal path 26 and the DC component received on conductor 156, the final amplifier circuit 30 includes an amplifier 158, a 10 ohm resistor 160, a 100 K resistor 162 and a 10 M resistor 161. The amplifier 158 is of the type CA 3130 T sold by RCA and has its noninverting input electrically connected to conductor 156 and its inverting input electrically connected to the AC signal path 26 through a conductor 166.

The output of amplifier 158 is electrically connected through conductor 164 to one end of resistor 162, the other end of resistor 162 being connected to one end of resistor 160 and one end of resistor 161. The other end of resistor 160 is connected to ground 96 and the other end of resistor 161 is electrically connected to conductor 166. The output of amplifier 158 is also connected through conductor 66 to the recorder output and meter 16 (FIG. 1).

With these connections, input resistance to the noninverting terminal of amplifier 158 is balanced to reduce the error voltages caused by bias currents, thus reducing error in the output signal of 158. This balancing resistance on the noninverting input includes a portion of the resistance of potentiometer 148, resistance 152, resistance 150, resistance 146, and resistance 151.

With this arrangement, the DC signal on conductor 156 is added to the AC signal on conductor 166 to result in an output signal on conductor 66 representing the input signal from the light sensor 12. Since the amplification of the DC signal is first processed by AC amplifiers, there is low draft and it is not necessary to utilize a zero adjustment on the circuit once the noise spike cancelling network and the variable resistance network are adjusted at the factory by setting potentiometer 94 and potentiometer 148 respectively.

This balancing is obtained by: (1) grounding the input through a 100 K resistor while using the highest gain range (50 megohm) feedback and adjusting the offset potential with potentiometer 148; and (2) then disconnecting the 100 K resistor and adjusting potentiometer 94 for zero output. These two adjustments are alternated back and forth until there is no change at the output when changing between steps (1) and (2) above.

Switches for range selection may be used to insert different series resistance between the output of the chopper-stabilized amplifier 14 and its input to determine its gain as in feedback circuit 21.

Figure 3:
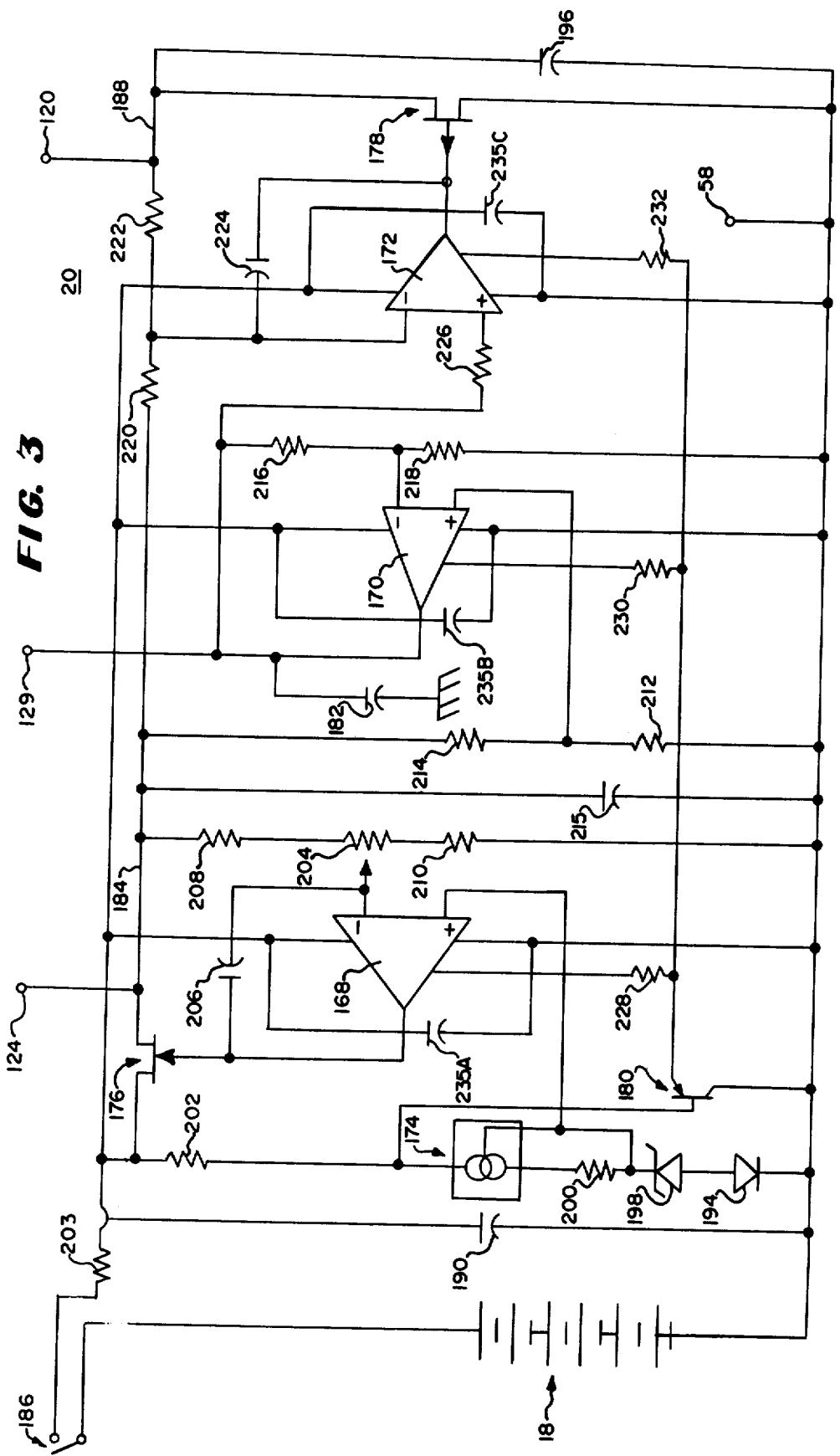
FIG. 3 is a schematic circuit diagram of a power supply used in the embodiment of FIG. 1.

In FIG. 3, there is shown a schematic circuit diagram of the DC power supply 20 and the battery 18 connected together to provide the negative 10 volt source 58, the negative 2.5 volt source 120, the positive 2.5 volt source 124, and the ground level potential 129. This circuit develops the ground level potential at a point between the sources 124 and 120 for the purpose of maintaining stability and obviating the need for a center tap to the battery 18.

To develop a ground level source and reference potential sources on either side of the ground level source, the DC power supply 20 includes first, second and third amplifiers 168, 170, and 172, first and second FET's 176 and 178, a three terminal constant current source 174 and a transistor 180.

To establish a ground level potential as a reference, the output of amplifier 170 is electrically connected to conductor 129, which conductor is also AC coupled through a 1.0 microfarad capacitor 182 to the instrument chassis to provide shielding for the circuitry.

To establish the positive 2.5 potential source 124, the gate electrode of the FET 176 is electrically connected to the output of the amplifier 168 and its source is electrically connected to a conductor 184 which is electrically connected to the positive 2.5 volt terminal. The drain of the FET 176 is electrically connected to the positive terminal of the battery 18 through a control switch 186 and a 100 ohm resistor 203.

To establish the negative 2.5 source 120, the FET 178 has its source electrically connected to a conductor 188 which is connected to the negative 2.5 terminal 120 and has its gate electrically connected to the output of the amplifier 172. The drain of the FET 178 is electrically connected to the negative terminal of the battery 18. The negative 10 volt potential terminal 58 is electrically connected directly to the negative terminal of the battery 18.

To supply a potential to the amplifiers 168, 170, and 172, the battery 18 has its positive potential electrically connected to one plate of a capacitor 190 and to the drain of FET 176 and has its negative potential electrically connected to the opposite plate of capacitor 190, to the collector transistor 180, to the cathode of a diode 194, and to one plate of a capacitor 196, the other plate of the capacitor 196 being electrically connected to conductor 188.

To establish a reference potential, a zener diode 198 has its anode electrically connected to the anode of the temperature compensating diode 194 and its cathode: (1) directly connected to the control of the three terminal constant current source 174; (2) electrically connected to the negative terminal of the three terminal constant current source 174 through a 1.2 K resistor 200; and (3) directly connected to the noninverting input of amplifier 168. The positive terminal of the three terminal constant current source 174 is electrically connected to one end of a 33 K resistor 202, the other end of the 33 K resistor 202 being electrically connected to the drain of the FET 176 and to the positive terminal of battery 18 through the resistor 203 and the on-off switch 186.

To control the output of the amplifier 168 and thus the FET 176 and source 124, the noninverting input of the amplifier 168 is electrically connected to the cathode of the zener diode 198 to receive a constant potential above the potential of source 58 and the inverting input is electrically connected to the center tap of a 100 K potentiometer 204 and to one plate of a 0.01 microfarad capacitor 206, the other plate of the capacitor 206 being electrically connected to the output of the amplifier 168.

One end of the potentiometer 204 is electrically connected to conductor 184 through a 392 K resistor 208 and the other end of the potentiometer 204 is electrically connected to the negative terminal of the battery 18 through a 412 K resistor 210 to provide an adjustment of the 2.5 volt potential in relation to tolerances in the zener diode 198. The potentiometer 204 is set to adjust the terminal 124 to a potential of 12.5 volts above the terminal 58. Once set, this potential is maintained even though the potential of the battery 18 changes with use or replacement.

If the potential of battery 18 drops, the potential at the connection of the drain of FET 176 and resistor 202 tends to drop but the potential at the control and negative terminals of the three terminal constant current source 174 and the potential at the noninverting terminal of the amplifier 168 are held at a constant potential above the terminal 58 by the zener diode 198. The three terminal constant current source 174 serves to bias zener diode 198 for constant voltage operation even though the battery voltage changes.

The constant current produced by the three terminal constant current source 174 and resistor 200 in combination flows through resistor 202 to provide a constant voltage drop across resistor 202. The base voltage biases transistor 180 to produce an approximately constant voltage at its emitter terminal with respect to the positive terminal of battery 18. This voltage at the emitter terminal of transistor 180 biases amplifiers 168, 170 and 172 with constant currents determined by resistors 228, 230 and 232 respectively. These constant currents to the amplifiers 168, 170 and 172 determine the characteristics of the amplifiers including their power dissipations, bandwidths and output drive current capability. Resistors 228, 230 and 232 are chosen to determine the performance parameters of the amplifiers 168, 170 and 172 in this specific design application. The constant current source 174 may be the type manufactured and sold by National Semiconductor as a 3-terminal adjustable current source LM 334.

The amplifiers 168, 170 and 172 are controlled with respect to each other to provide the positive 2.5 volts above ground, the ground potential (arbitrarily selected as 10 volts) and negative 2.5 volts below ground in a fixed relationship for use in the light meter. To control the output of the amplifier 168 and thus the 12.5 volt potential above terminals 58 (a positive 2.5 volts above ground terminal 129), the noninverting input of the amplifier 168 is biased at a constant voltage above terminal 58 by the zener diode 198 and the temperature compensation diode 194 in combination.

When the potential at terminal 124 changes under load conditions, this change occurs across resistor 208, resistor 210 and the potentiometer 204. The inverting terminal of amplifier 168 senses the change from the midpoint connection on potentiometer 204. This change is compared to the reference potential on the noninverting terminal of amplifier 168 and thus, the amplifier 168 produces a correction voltage to the control gate of FET 176 which correspondingly changes the conduction of FET 176 to allow more or less battery voltage to correct potential 124 to a constant 12.5 volts with respect to terminal 58. The battery 18 can thus change from its high extreme of 30 volts to a minimum of approximately 12.6 volts with very little effect on the potential at terminal 124 established with reference to the zener diode 198.

To control the input of amplifier 170 and thus ground potential at terminal 129, the noninverting input of the amplifier 170 is electrically connected to the negative terminal of the battery 18 through a 200 K resistor 212 and to conductor 184 through a 301 K resistor 214. A 15 microfarad capacitor 215 has one plate connected to conductor 184 and one plate connected to the negative terminal of battery 18 to filter the potential at terminal 124.

The inverting terminal of the amplifier 170 is electrically connected to the ground source 129 through a 221 K resistor 216 and to the negative terminal of the battery 18 through a 221 K resistor 218. Since the potential between terminal 58 and conductor 184 is held at 12.5 volts, the potential at the noninverting terminal of amplifier 170 remains constant. Consequently, if the potential at terminal 129 tends to shift, the amplifier 170 receives a signal at its inverting terminal that causes the amplifier to hold the potential at terminal 129 constant.

To control the input of amplifier 172 and thus the potential at terminal 120, the noninverting input terminal of the amplifier 172 is electrically connected to terminal 129 through the 100 K resistor 226. This provides a reference for amplifier 172. The inverting terminal of the amplifier 172 is electrically connected to conductor 184 through a 221 K resistor 220 and to conductor 188 through a 221 K resistor 222. If the potential at terminal 120 varies because of load, the inverting input of amplifier 172 senses the difference between it and the potential on conductor 184. This error signal is compared to the ground reference on the noninverting input of the amplifier 172, causing the amplifier 172 to produce a correction signal to the gate of FET 178 to correct the potential on conductor 188.

The amplifiers 168, 170 and 172 are Fairchild type 776 or National Semiconductor LM 4250 type amplifiers, each having externally connected 0.01 microfarad capacitors 235A-235C connected across them and between the drain of FET 176 and terminal 58. To filter noise from the battery potential of battery 18, the capacitors 235A-235C are physically located in close proximity to the amplifiers 168, 170 and 172 respectively.

With these a ground potential is provided between a positive 2.5 volts and a negative 2.5 volts without the need for a center tap on the battery, thus avoiding shifts in these potentials with respect to ground due to one of a series of batteries being weakened with respect to the other.

In FIG. 4, there is shown a schematic circuit diagram of the feedback circuit 21 having an input electrically connected to conductor 66 and an output electrically connected to conductor 60 to stabilize the chopper-stabilized amplifier 14 and select the range of its operation.

The feedback circuit 21 includes a switch 244 and an impedance network 246, the switch 244 having a switch arm 248 and nine contacts 250A-250I respectively, and the impedance network 246 having nine resistors, 252A-252I respectively, and a 1,000 picofarad capacitor 254.

Each of the resistors 252A-252I: (1) is electrically connected at one end to conductor 60 and at its other end to a corresponding one of the contacts 250A-250I of the switch 244; and (2) has a corresponding one of the values respectively of 4.99 K, 15.0 K, 49.9 K, 150 K, 499 K, 1.5 M, 5.0 M, 15.0 M, and 50.0 M. With these connections, ranges are selected between 3 and 30,000 for the chopper-stabilized amplifier 14 in the following sequence from contacts 250A-250I: 30,000, 10,000, 3,000, 1,000, 300, 100, 30, 10, and 3. Capacitor 254 has one plate electrically connected to conductor 66 and the other directly connected to conductor 60.

As can be understood from the above description, the light meter 10 of this invention has special advantages as a portable light meter in that it: (1) has low power drain, thus conserving batteries; (2) is not subject to excessive noise; and (3) is able to operate without a zero setting and without the high noise conditions that would be expected through the use of a chopper-stabilized amplifier.

Although a specific embodiment has been described with some particularity, many modifications and variations in the invention are possible in the light of the above description. It is therefore to be understood that, within the scope of the appended claims, the invention may be practiced other than as specifically described.

What is claimed is:

1. A light meter comprising:
    sensor means for developing an electrical signal representing radiant energy impinging upon said sensor means;
    amplifier means electrically connected to said sensor means for amplifying said electrical signal without a DC potential error;
    said amplifier means including conductor means for receiving a ground level signal, a positive potential and a negative potential for operation of said amplifier means;
    a constant potential DC power supply for said amplifier means including a three terminal constant current source, whereby said light meter is portable;
    each of said terminals of said constant current source applying a different one of said positive potential, ground level potential and negative potential to said amplifier means;
    said power supply including means for developing a ground level signal;
    said means for developing including an amplifier;
    said amplifier means being adapted to be electrically connected to a battery pack; and
    said ground level signal being developed at the output of said amplifier, whereby a center tap for the battery pack is not needed in said power supply.

2. A light meter according to claim 1 in which said amplifier means includes a chopper-stabilized amplifier having its input electrically connected to said sensor means, whereby the signal from said sensor means is chopped by said amplifier means.

3. A light meter according to claim 2 in which said chopper-stabilized amplifier includes:
    a chopper circuit including an FET and an impedance network electrically connected to said FET for compensating for the electrode capacitance of said FET;
    said chopper circuit being electrically connected to said light sensor; and
    said impedance network having a high impedance, whereby load on said battery is reduced.

4. A light meter according to claim 3 in which said chopper-stabilized amplifier includes a bandpass filter, whereby oscillation at low power levels is avoided.

5. A light meter according to claim 4 in which said chopper-stabilized amplifier includes:
    at least one AC amplifier and input bias means for said AC amplifiers; and said input impedance being shielded from the input of said AC amplifier.

6. A light meter according to claim 2 in which said chopper-stabilized amplifier includes a bandpass filter, whereby oscillation at low power levels is avoided.

7. A light meter according to claim 2 in which said chopper-stabilized amplifier includes:
at least one AC amplifier and input bias means for said AC amplifier; and
said input bias means being shielded from said AC amplifier.

8. A light meter comprising:
sensor means for developing an electrical signal representing radiant energy impinging upon said energy means;
amplifier means electrically connected to said sensor means for amplifying said electrical signal without a DC potential error;
said amplifier means including conductor means for receiving a ground potential, a positive potential and a negative potential, whereby electrical energy is applied to said amplifier means to permit operation;
a constant potential DC power supply for said amplifier means including a three terminal constant current source, whereby said light meter is portable;
each of said three terminals being electrically connected to a different one of said conductor means; and
said amplifier means including a chopper-stabilized amplifier.

9. A light meter according to claim 8 in which said chopper-stabilized amplifier includes:
a chopper circuit including an FET and an impedance network electrically connected to said FET for compensating for the electrode capacitance of said FET;
said chopper circuit being electrically connected to said light sensor; and
said impedance network having a high impedance, whereby load on said battery is reduced.

10. A light meter according to claim 9 in which said chopper-stabilized amplifier includes a bandpass filter, whereby oscillation at low power levels is avoided.

11. A light meter according to claim 10 in which said chopper-stabilized amplifier includes:
at least on AC amplifier and input bias means for said AC amplifiers; and
said input impedance being shielded from the input of said AC amplifier.

12. A light meter according to claim 8 in which said chopper-stabilized amplifier includes a bypass filter, whereby oscillation at low power levels is avoided.

13. A light meter according to claim 8 in which said chopper-stabilized amplifier includes:
at least one AC amplifier and input bias means for said AC amplifiers; and
said input impedance being shielded from the input of said AC amplifier.

14. A light meter according to claim 13 in which said chopper-stabilized amplifier includes:
a chopper circuit including an FET and an impedance network electrically connected to said FET for compensating for the electrode capacitance of said FET;
said chopper circuit being electrically connected to said light sensor; and
said impedance network having a high impedance, whereby load on said battery is reduced.

15. A light meter according to claim 15 in which said chopper-stabilized amplifier includes a bandpass filter, whereby oscillation at lower power levels is avoided.

* * * * *